United States Patent [19]

Furuyama et al.

[11] Patent Number: 5,144,381
[45] Date of Patent: Sep. 1, 1992

[54] SEMICONDUCTOR LIGHT DETECTOR UTILIZING AN AVALANCHE EFFECT AND HAVING AN IMPROVED GUARD RING STRUCTURE

[75] Inventors: Hideto Furuyama, Tokyo; Tetsuo Sadamasa, Chigasaki, both of Japan

[73] Assignee: Kabushiki Kaisha Toshiba, Kawasaki, Japan

[21] Appl. No.: 602,174

[22] Filed: Oct. 23, 1990

Related U.S. Application Data

[62] Division of Ser. No. 413,489, Sep. 27, 1989, Pat. No. 4,992,386.

[30] Foreign Application Priority Data

Dec. 14, 1988 [JP] Japan .................. 63-315619

[51] Int. Cl.$^5$ .................... H01L 29/205; H01L 31/06
[52] U.S. Cl. ........................ 357/30; 357/16; 357/13
[58] Field of Search ............... 357/30 A, 30 E, 30 N, 357/30 L, 16, 30, 13

[56] References Cited

U.S. PATENT DOCUMENTS

| | | | |
|---|---|---|---|
| 4,442,444 | 4/1984 | Osaka | 357/30 |
| 4,481,523 | 11/1984 | Osaka et al. | 357/30 |
| 4,651,187 | 3/1987 | Sugimoto et al. | 357/30 |
| 4,725,870 | 2/1988 | Beau et al. | 357/30 |
| 4,840,916 | 6/1989 | Yasuda et al. | 357/30 |
| 4,877,951 | 10/1989 | Muro | 357/30 |
| 4,935,795 | 6/1990 | Mikawa et al. | 357/30 |
| 4,974,061 | 11/1990 | Torikai | 357/30 |

FOREIGN PATENT DOCUMENTS

| | | | |
|---|---|---|---|
| 053513 | 6/1982 | European Pat. Off. | 357/30 |
| 159544 | 10/1985 | European Pat. Off. | 357/30 |
| 2331884 | 11/1976 | France | |
| 61-191082 | 8/1986 | Japan | 357/30 |
| 61-220481 | 9/1986 | Japan | 357/30 |

*Primary Examiner*—Jerome Jackson, Jr.
*Attorney, Agent, or Firm*—Oblon, Spivak, McClelland, Maier & Neustadt

[57] ABSTRACT

A semiconductor light detector includes a first semiconductor layer of a first conductivity type having a multilayer structure including a light absorbing layer and an avalanche multiplicating layer, an annular second semiconductor layer formed on the first semiconductor layer, a light detecting region formed by doping an impurity of a second conductivity type in a surface region of the first semiconductor layer, in such a manner that a peripheral portion of the light detecting region is located outside an inner periphery of the second semiconductor layer, the light detecting region defining a first p-n junction in combination with the first semiconductor layer, and a guard ring formed by doping an impurity of the second conductivity type in a surface region of the second semiconductor layer to surround the peripheral portion of the light receiving region with the first semiconductor layer, the second p-n junction having a concentration gradient lower than that of the first p-n junction. By virtue of the presence of the second semiconductor layer, the junction depth of the peripheral portion of the light detecting region is less than that of the central portion of the light detecting region, and the junction depth of the guard ring is greater than that of the peripheral portion of the light detecting region. As a result, a sufficient guard ring effect can be obtained without a guard ring having a great junction depth.

11 Claims, 10 Drawing Sheets

SEMICONDUCTOR LIGHT DETECTOR UTILIZING AN AVALANCHE EFFECT AND HAVING AN IMPROVED GUARD RING STRUCTURE

This is a division of application Ser. No. 07/413,489, filed on Sep. 27, 1989 now U.S. Pat. No. 4,992,386.

BACKGROUND OF THE INVENTION

1. Field of the Invention

The present invention relates to a semiconductor light detector utilizing an avalanche effect and, more particularly, to a semiconductor light detector having an improved guard ring structure and a method of manufacturing the same.

2. Description of the Related Art

In recent years, an avalanche photo diode (to hereinafter be referred to as an APD) has been used as a high-sensitivity light detector in such fields as optical fiber communication systems. An APD is a device utilizing avalanche-carrier multiplication of a semiconductor crystal, and has an avalanche region having a high electric field inside the device. For this reason, a guard ring structure is important to prevent local breakdown caused by electric field concentration in the avalanche region; in particular, in the peripheral portion of the avalanche region.

An optical communication system generally uses an APD which includes a light detection layer (light absorption layer) consisting of GaInAs (having a composition lattice-matched with InP) having high sensitivity in a low-loss range (wavelength; 1.3 to 1.5 μm) of a quartz optical fiber, carriers generated in the light receiving layer being subjected to avalanche multiplication by InP.

Since a high electric field region necessary for avalanche multiplication is formed at a front portion of a p-n junction having a sharp concentration gradient (to hereinafter be referred to as a steeply graded junction), electric field concentration tends to occur at the end portion of the front portion, due to the curvature of the end portion, as a result of which a so-called local breakdown tends easily to occur.

In order to solve the above problem, a guard ring is formed. By arranging the guard ring, a p-n junction having a slow concentration gradient (to be referred to as a moderately graded junction hereinafter) is formed at the end portion of the front portion of the steeply graded junction.

In the moderately graded junction, a breakdown voltage is generally high and an electric field concentration effect due to the curvature is insufficient. Therefore, the guard ring can suppress the local breakdown. At this time, the depth of the moderately graded junction must be slightly larger than that of the steeply graded junction. If the steeply graded junction is too close to the moderately graded junction, the effect of the moderately graded junction is decreased. In addition, a method of equivalently increasing the curvature of an impurity doped interface can effectively suppress the local breakdown.

A conventional APD wherein a guard ring is formed will be described hereinafter with reference to FIGS. 1 to 4.

Figure 1:
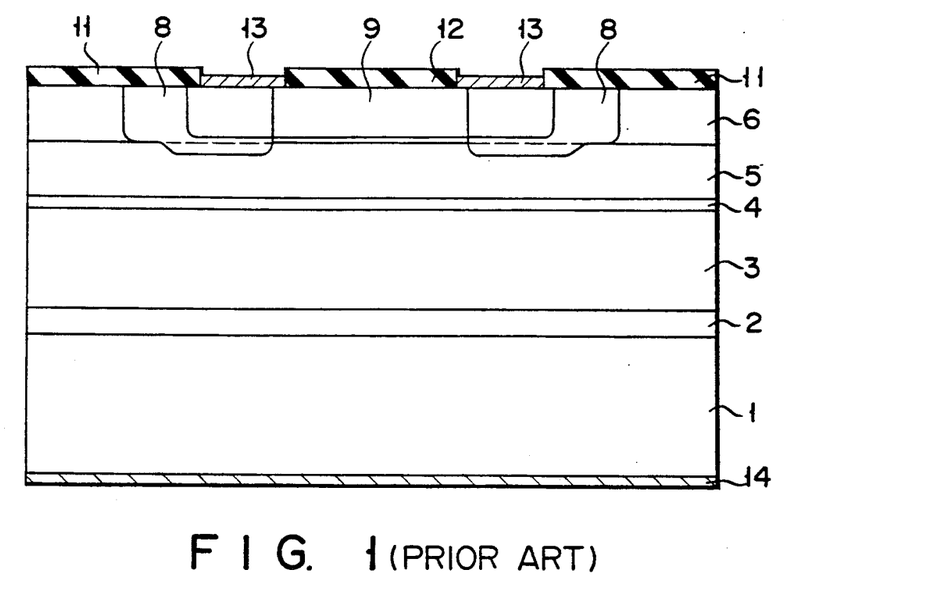
FIGS. 1 to 4 are sectional views showing a structure of a conventional avalanche photodiode (APD)

FIG. 1 is a sectional view showing an example of a conventional APD disclosed in Lecture Papers of the 46th Lectures of the Japan Society of Applied Physics, 1985, Autumn. In FIG. 1, an n-InP buffer layer 2, an $n^-$-GaInAs light absorbing layer 3, an $n^{--}$-GaInAsP (composition having an absorption edge wavelength of 1.3 μm) intermediate layer 4, an n-InP avalanche multiplication/electric field relaxation layer 5, an $n^{--}$-InP window layer 6, a p-type guard ring 8 for forming a moderately graded junction, a p-type light receiving region 9 for forming a steeply graded junction, an insulating layer 11, and a non-reflection coating layer 12 are sequentially formed on an n-InP substrate 1. An electrode 13 is formed on an exposing surface of the light detection layer 9, and an electrode 14 is formed on a lower surface of the substrate 1.

In the APD having the above structure, a depletion layer extends under the p-type regions 8 and 9, and carriers generated in the light absorbing layer 3 are guided to a high electric field region concentrated in the p-n junction region and are subjected to avalanche multiplication. In the optical communication APD, in order to minimize a decrease in response speed due to the avalanche multiplication, the light detecting region 9 is generally formed close to the n-InP layer 5 to decrease the width of the high electric field region. Therefore, the junction defined by the guard ring 8 is formed to extend in the n-InP layer 5. However, since the impurity concentration of the n-InP layer 5 is relatively high, an effect of the moderately graded junction on the interface of the guard ring 8 tends to be insufficient, thus easily causing local breakdown. In the prior art shown in FIG. 1, a shallow guard ring is expanded in a longitudinal direction to prevent the local breakdown. This is equivalent to an increase in curvature of the peripheral portion of the guard ring. In such a prior art, however, the electric field value of the light detection layer 3 tends to increase because the moderately graded junction is deep under the steeply graded junction, and a current generated in a hetero-interface or a dark current due to a tunnel current in the light detection layer 3 tends to be increased. The above problems are posed when the impurity concentration of the n-InP layer 5 is increased and the thickness thereof is decreased to achieve a high-speed operation.

Figure 2:
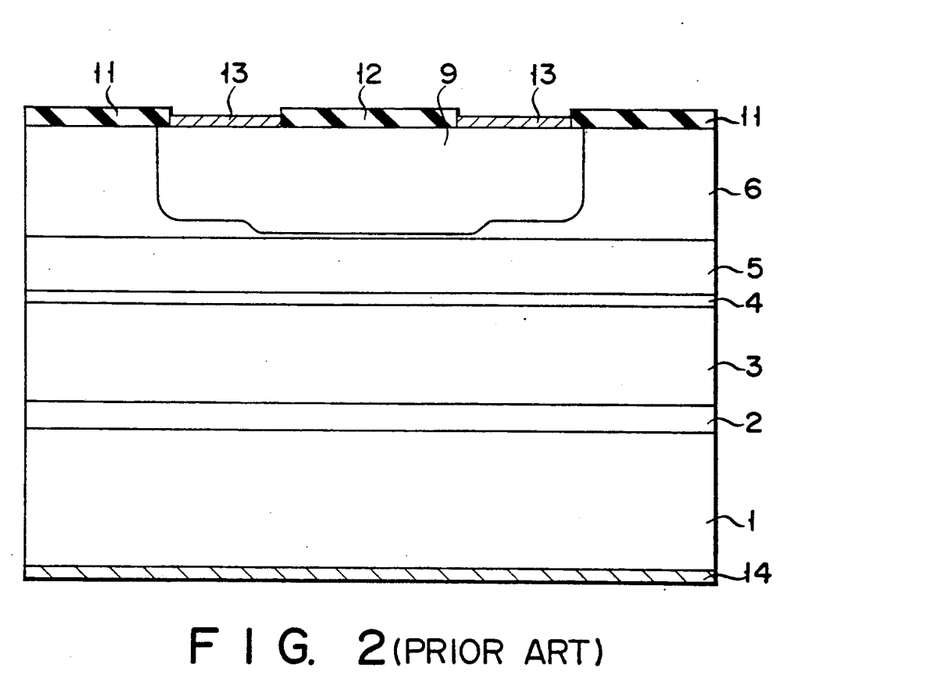

FIG. 2 is a sectional view showing a prior art wherein the shape of the interface portion of the steeply graded junction is changed and the equivalent curvature of the interface is increased. This prior art is disclosed in the Institute of Electronics and Communication Engineers of Japan, the National Meeting, Lecture Papers C - 172, 1988, Autumn. In this prior art, a guard ring providing the moderately graded junction is not formed, but only the shape of the interface portion of the steeply graded junction prevents local breakdown. This moderately grated junction is formed by thermal diffusion of Zn, Cd, or the like. A central light detecting region (projection) is formed by selective forced diffusion of an impurity. As a result, a high electric field region is formed in the central projection, and the electric field concentration in the projection interface is decreased.

In such a structure, a dark current is not unnecessarily increased, as compared with the prior art in FIG. 1, and an element almost free from the dark current can be obtained. In such a structure, however, in order to relax the curvature of the peripheral front portion of the steeply graded junction, relatively deep diffusion (about 6 μm) is performed, and the thickness of the n-InP layer 6 must be increased as compared with that in diffusion (diffusion depth: 1 to 2 μm) using a normal moderately graded junction (guard ring). For this reason, cost is undesirably increased to perform crystal growth. In addition, controllability of the diffusion depth is degraded because of deep diffusion, and flatness of the front portion of the diffusion region is easily damaged. Therefore, the nonuniformity of the light detection sensitivity undesirably tends to occur over the light detection region. In addition, when the front portion of the diffusion region approaches the n-InP layer 5 in order to achieve a high-speed operation of the device, local breakdown in the front peripheral portion tends to occur again. As a result, this structure is not suitable for a high-speed APD.

Figure 3:
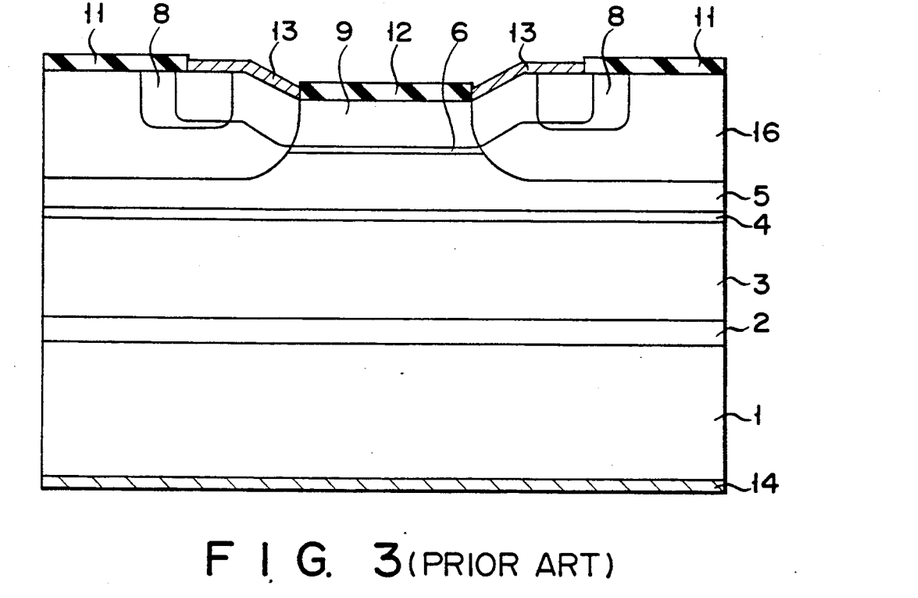

FIG. 3 shows a prior art wherein a part of the n-InP layer 5 on which the guard ring is to be formed is removed, and another n⁻-InP layer 6 is grown again. This prior art is disclosed in Japanese Patent Disclosure No. 61-220481. In this prior art, the guard ring providing the moderately graded junction is formed in the front peripheral portion of the steeply graded junction. However, since the thickness of the n⁻-InP layer 6 grown again is relatively large, the moderately graded junction can hardly affect the light detection layer 3. In addition, since the diffusion depth is normal and the shape of the diffusion front can be deformed at a regrowth interface, a substantially ideal guard ring structure can be obtained by performing optimization. Such an excellent structure is suitable for a high-speed APD, and problems on its characteristics can be substantially solved.

The drawbacks of the above structure are, however, caused by the such problems in a manufacturing method that a regrowth interface exists in the high electric field region and double crystal growth must be performed. More specifically, a perfect regrowth interface is required to withstand a high electric field wherein avalanche multiplication can be performed. Therefore, crystal regrowth almost free from an interface level is required. For this reason, the following method has been employed. That is so-called "melt back" (etching in a growth furnace by crystal growth melt) is slightly performed by an LPE (liquid phase epitaxy) to clean the surface. By employing this method, a substantially perfect regrowth interface can be obtained. However, since the LPE is employed as a regrowth method, the following problems are posed. For example, a wafer size is limited, the flatness of the regrowth interface is easily damaged, and the number of factors to reduce a manufacturing yield is increased. In addition, since the thickness of the layer formed by the second crystal growth is large, i.e., 2 to 3 μm, cost is undesirably increased because of the second crystal growth.

Figure 4:
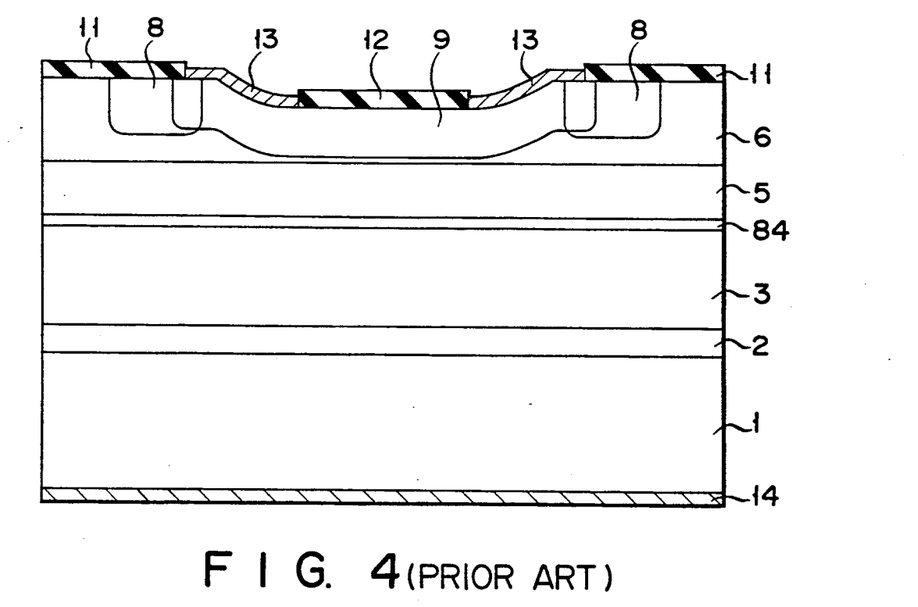

FIG. 4 shows a prior art having the above advantages of the prior arts shown in FIGS. 1 and 2. This prior art is disclosed in Japanese Patent Disclosure No. 61-191082. In this prior art, the thickness of the n⁻-InP layer 6 is slightly increased, and the central light detection region portion is removed by etching or ion milling to obtain a smooth profile. Thereafter, a moderately graded junction is formed. The guard ring 8 providing the moderately graded junction is formed in the front peripheral portion of the steeply graded junction. In the structure according to this prior art, the n⁻-InP layer obtained by regrowth is not required, and the diffusion depth of the steeply graded junction may be relatively small. Therefore, the above problems are not posed. However, in such a prior art, the extremely high-precision controllability of etching or ion milling is required, so that the manufacturing yield becomes low.

SUMMARY OF THE INVENTION

It is an object of the present invention to provide a semiconductor light detector which can increase a breakdown voltage of a guard ring, and can decrease a dark current.

It is another object of the present invention to provide a method of manufacturing the semiconductor light detector at a high manufacturing yield without an increase in manufacturing cost.

According to the present invention, there is provided a semiconductor light detector comprising a first semiconductor layer of a first conductivity type having a multi-layer structure including a light absorbing layer and an avalanche multiplicating layer, an annular second semiconductor layer formed on the first semiconductor layer, a light detecting region formed by doping an impurity of a second conductivity type in a surface region of the first semiconductor layer in such a manner that a peripheral portion of the light detecting region is located outside an inner periphery of the second semiconductor layer, the light detecting region defining a first p-n junction with the first semiconductor layer, and a guard ring formed by doping an impurity of the second conductivity type in a surface region of the first semiconductor layer to surround the peripheral portion of the light detecting region, the guard ring defining a second p-n junction with the first semiconductor layer, the second p-n junction having a concentration gradient smaller than that of the first p-n junction, wherein a junction depth of the peripheral portion of the light detecting region is smaller than that of a central portion of the light detecting region, and a junction depth of the guard ring is larger than that of the peripheral portion of the light detecting region.

According to the present invention, there is further provided a method of manufacturing the semiconductor light detector, comprising the steps of doping an impurity of a second conductivity type in a surface region of a first semiconductor layer of first conductivity type having a multi-layer structure including a light absorbing layer and an avalanche multiplicating layer to form a guard ring, the guard ring defining a second p-n junction, forming an annular second semiconductor layer on a surface of the first semiconductor layer corresponding to the guard ring, forming a masking layer on a peripheral portion of the second semiconductor layer and a surface of the first semiconductor layer outside the peripheral portion, and doping an impurity of a second conductivity type in the first semiconductor layer using the masking layer as a mask in such a manner that a diffusion depth of a central portion of the first semiconductor layer is larger than that of the guard ring, and that a diffusion depth of a peripheral portion of the first semiconductor layer is smaller than that of the guard ring so as to form a light detecting region, the light receiving region defining a first p-n junction having a concentration gradient larger than that of the second p-n junction.

According to the present invention, there is further provided a method of manufacturing the semiconductor light detector, comprising the steps of forming a first mask layer including an annular window on a surface of a first semiconductor layer of a first conductivity type having a multi-layer structure including a light absorbing layer and an avalanche multiplicating layer, selectively forming a spacing layer on the first semiconductor layer, the first semiconductor layer being exposed in the annular window, doping an impurity of a second conductivity type in a surface region of the first semiconductor layer through the spacing layer to form a guard ring, the guard ring defining a second p-n junction, forming a second masking layer on a surface of the first semiconductor layer outside the second semiconductor layer, and doping an impurity of the second conductivity type in the first semiconductor layer using the second masking layer as a mask in such a manner that a diffusion depth of a central portion of the first semiconductor layer is larger than that of the guard ring and that a diffusion depth of a peripheral portion of the first semiconductor layer is smaller than that of the guard ring so as to form a light detecting region, the light detecting region defining a first p-n junction having a concentration gradient larger than that of the second p-n junction.

DETAILED DESCRIPTION OF THE PREFERRED EMBODIMENTS

Various preferred embodiments according to the present invention will be described hereinafter with reference to the accompanying drawings.

Figure 5:
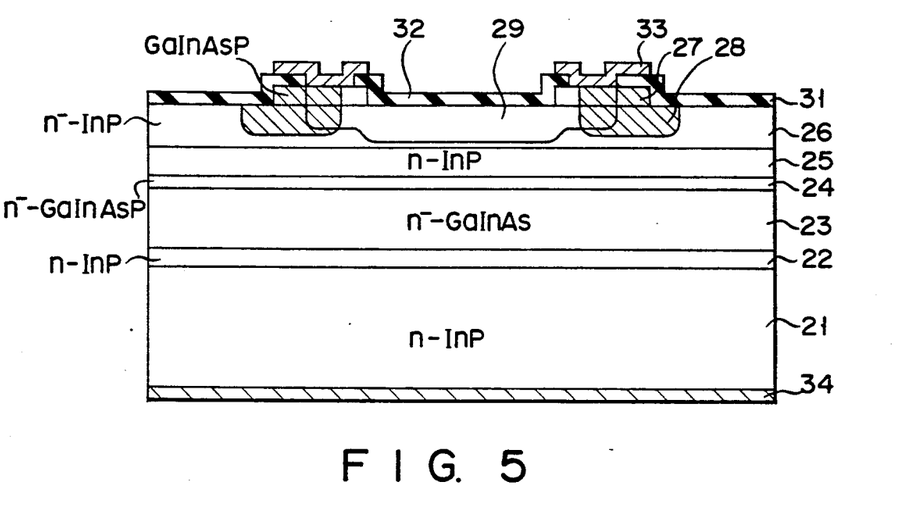
FIG. 5 is a sectional view showing a structure of an APD according to a first embodiment of the present invention.

FIG. 5 is a sectional view showing a schematic structure of an APD according to a first embodiment of the present invention. In FIG. 5, reference numeral 21 denotes an n-InP substrate. On the substrate 21, an n-InP buffer layer 22 (carrier concentration: $5 \times 10^{16}$ cm$^{-3}$ or less; thickness: 0.5 μm), an n$^-$-GaInAs light absorption layer 23 (carrier concentration: $1 \times 10^{15}$ cm$^{-3}$; thickness: 2 μm), an n-GaInAsP intermediate layer 24 (absorption edge wavelength: 1.3 μm; carrier concentration: $2 \times 10^{16}$ cm$^{-3}$ thickness: 0.4 μm), an n-InP multiplication layer 25 (carrier concentration: $4 \times 10^{16}$ cm$^{-3}$; thickness: 0.8 μm), and an n$^-$-InP layer 26 (carrier concentration: $1 \times 10^{15}$ cm$^{-3}$; thickness: 1.2 μm) are grown. In addition, an annular GaInAsP spacing layer 27 (absorption edge wavelength: 1.3 μm; undoped; thickness: 0.2 μm) is grown on the n$^-$-InP layer 26. In the InP layer 26, a p-type region (guard ring) 28 is formed by implanting Be ions, and a p-type region (light detecting region) 29 is formed by diffusing Cd or Zn ions. An insulating film 31, a non-reflection film 32, and an electrode 33 are formed on an upper surface of the above structure, and an electrode 34 is formed on a lower surface of the n-InP substrate. Note that the insulating film 31 and the non-reflection film 32 consist of silicon nitride films, and the electrodes 33 and 34 consist of AuZn and AuGe, respectively.

The conditions for Be ion implantation to form a moderately graded p-n junction is as follows. That is, the Be ions are implanted at an accelerated energy of 200 keV and a dose of $1 \times 10^{13}$ cm$^{-2}$. After the ion implantation, annealing is performed at 700° C. for 20 minutes. In the diffusion of Cd or Zn to form a steeply graded p-n junction, e.g., vapor diffusion of Cd is performed at 560° C. for 20 minutes by a closed ampoule (10 cc, $1 \times 10^{-6}$ Toor at a room temperature) method using Cd$_3$P$_2$ (20 mg) as a source. Therefore, the central diffusion front of the light detecting region 29 is extremely close to the n-InP layer 25, and the depth of the peripheral diffusion front is smaller than that of the central portion. The diffusion front of the guard ring 28 is defined between the central and peripheral portions of the diffusion front of the light detecting region 29. For example, an MOCVD method is employed as a crystal growth method of the layers 22 to 27. According to this method, the crystal is grown at 620° C.

With such a structure, a sufficient avalanche break down voltage of about 60 V and a sufficient guard ring breakdown voltage of 80 V or more can be obtained. A dark current of the element in the light detecting region having a diameter of 50 μm is 10 nA or less, thus obtaining an excellent APD.

In the above-mentioned APD shown in FIG. 5, by forming the annular semiconductor spacing layer 27 on the flat semiconductor multi-layer film, the junction depth of the peripheral portion of a steeply graded p-n junction can be decreased, as compared with that of the central portion, by a depth substantially corresponding to the thickness of the spacing layer 27. A sufficient guard ring effect can be obtained while flatness of the surface of the semiconductor multi-layer film is kept without a guard ring having a large junction depth. Therefore, a guard ring breakdown voltage can be improved, and a dark current can be decreased.

A method of manufacturing the above mentioned APD shown in FIG. 5 will be described hereinafter with reference to FIGS. 6A to 6D.

Figure 6A:
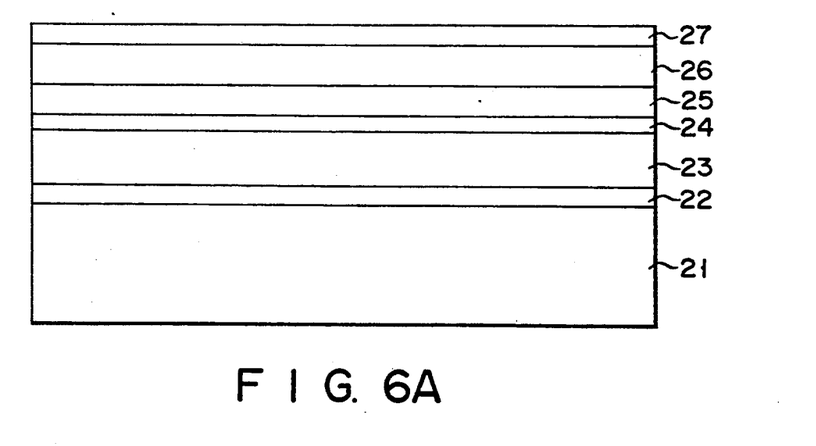
FIGS. 6A to 6D are sectional views showing the steps in manufacturing the APD shown in FIG. 5.
Figure 6B:
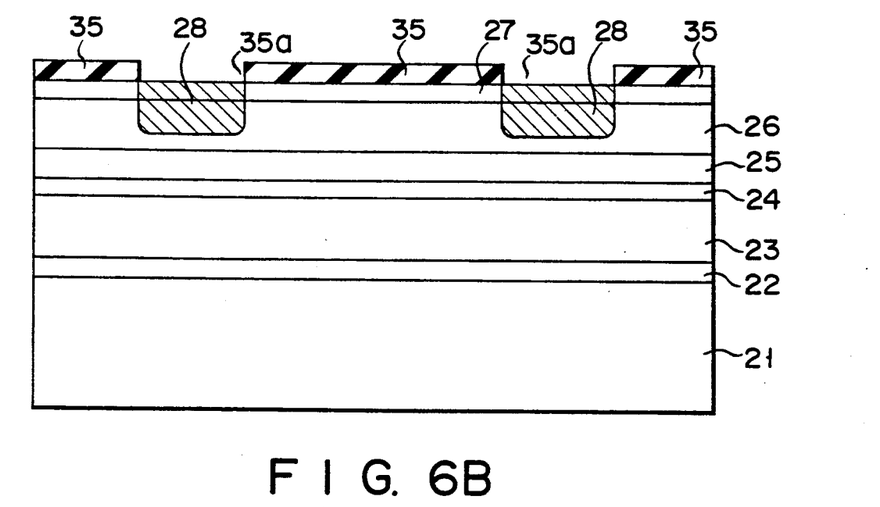

As shown in FIG. 6A, the above-mentioned layers 22 to 27 are formed on the n-InP substrate 21 by crystal growth. Then, as shown in FIG. 6B, an SiO$_2$ film 35 having a thickness of about 8.000 Å is formed on the GaInAsP spacing layer 27, and an annular window 35a is formed on the SiO$_2$ film 35. In order to form this window 35a, a resist pattern (not shown) is formed on the SiO$_2$ film 35, and etching is performed for about one minute using the resist pattern as a mask and using an NH$_4$F aqueous solution as a etchant. Using the SiO$_2$ film 35 having the window 35 as a mask, Be ions are implanted in an annular region having an inner diameter of 55 μm, and an outer diameter of 80 μm. Then, annealing is performed. Therefore, a p-type region (guard ring) 28 is formed in the InP layer 26.

Figure 6C:
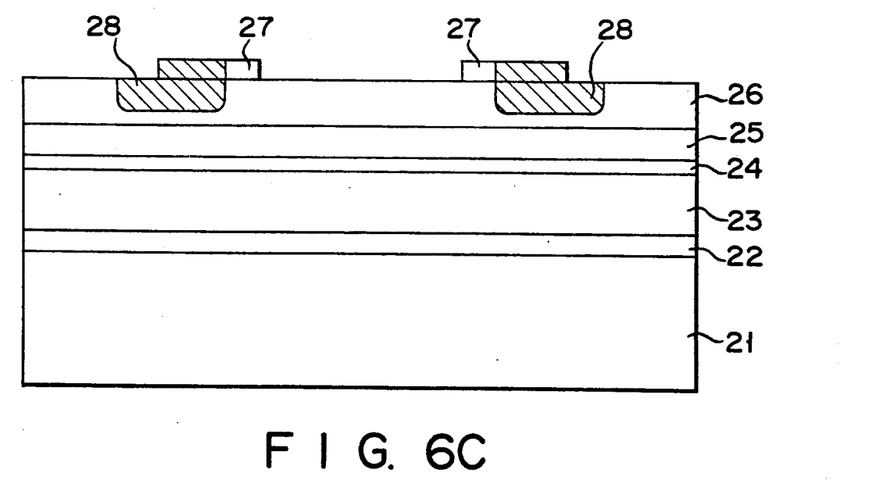

As shown in FIG. 6C, then, the SiO$_2$ film 35 is removed. Thereafter, the GaInAsP spacing layer 27 is etched to form an annular layer which partially overlaps the window and has a diameter slightly smaller than that of the window. In this etching, after the resist mask is formed on the spacing layer 27, the resultant spacing layer 27 may be selectively etched at 26° C. for about one minute using an etching solution obtained by mixing sulfuric acid, a hydrogen peroxide aqueous solution, and water at a ratio of 4:1:1, in the order named.

Figure 6D:
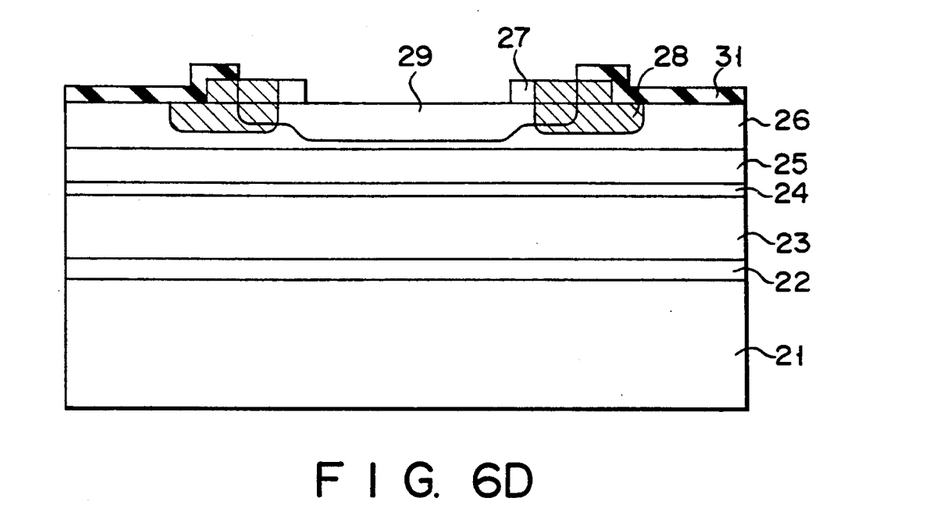

As shown in FIG. 6D, the silicon nitride film 31 is deposited on the entire surface by plasma CVD. Thereafter, a circular diffusion window having a diameter of 60 μm is formed on the silicon nitride film 31. That is, the portion of the silicon nitride film 31, which is on the spacing layer 27 excluding the peripheral portion and surrounded by the spacing layer 27, is removed. Thermal diffusion of Cd or Zn is performed to form the p-type region (light detecting region) 29. At this time, as shown in FIG. 6D, the central diffusion front of the light detecting region 29 is extremely close to the n InP layer 25, and the peripheral diffusion front of the light detecting region 29 is away from the layer 25 due to the presence of the spacing layer 27. In addition, by selecting an appropriate thickness of the spacing layer 27, the depth of the central diffusion front of the light detecting region 29 can be larger than that of the diffusion front of the guard ring 28, and the depth of the peripheral diffusion front of the light detecting region 29 can be smaller than that of the diffusion front of the guard ring 28. Thereafter, the non-reflection film 32, the electrodes 33, 34, and the like are formed, so that the device shown in FIG. 5 is obtained.

In the APD thus manufactured, since the depth of the peripheral diffusion front of the light detecting region 29 is smaller than that of the central diffusion front of the region 29, the depth of the diffusion front of the guard ring 28 can be larger than that of the peripheral diffusion front of the light detecting region 29 without extending into the n-InP layer 25. Therefore, a sufficient guard ring breakdown voltage can be obtained and a dark current can be minimized. In this case, only single crystal growth is required in the manufacturing steps, and the kind of growth technique is not limited. In the light detecting region 29, a difference between the depth of the central diffusion front and that of the peripheral diffusion front is defined by the thickness of the spacing layer 27. Therefore, excellent controllability can be obtained as compared with a method of processing the InP layer 26 by etching or ion milling. In addition, the crystal surface is substantially flat, and sufficient flatness can be kept as a planar type device. Therefore, the excellent device characteristics are obtained, and simple manufacturing and mounting are effectively performed.

Figure 7:
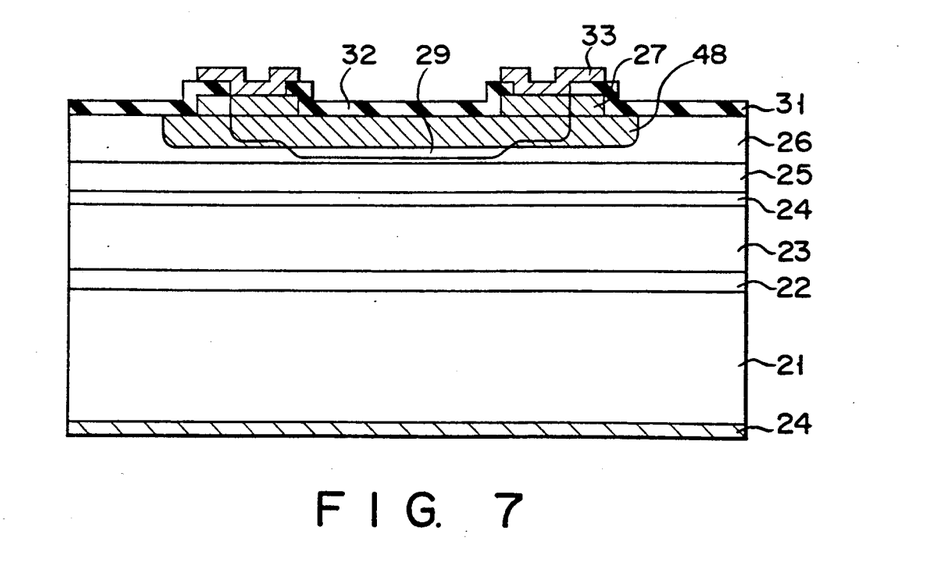
FIG. 7 is a sectional view showing a structure of an APD according to a second embodiment of the present invention.

FIG. 7 is a sectional view showing a schematic arrangement of an APD according to a second embodiment of the present invention. The same reference numerals in FIG. 7 denote the same parts as in FIG. 5, and a detailed description thereof will be omitted.

A difference between the above-mentioned embodiment and this embodiment is that Be ions are implanted in the entire surface of a p-n junction region to form a guard ring in this embodiment. More specifically, ions are not implanted in an annular region, but are implanted in a circular region 48 having a diameter larger than that of a light detecting region 29. Only a change in pattern, i.e., removal of the central portion of the ion-implantation mask is required to allow the ion implantation to the entire surface of the p-n junction region.

The Be ions are implanted in the entire surface in this embodiment. However, in the central region, the depth of a moderately graded p-n junction obtained by implanting Be ions is smaller than that of a steeply graded p n junction obtained by implanting Cd or Zn, so that the element characteristics are little affected. A feature of this embodiment is as follows. That is, the overlap margin of the guard ring formed by diffusion of Be ions and the light detecting region formed by diffusion of Cd or Zn is increased to allow a decrease in size of the pattern, so that the entire p-n junction area is reduced, thus decreasing a parasitic capacitance.

Figure 8:
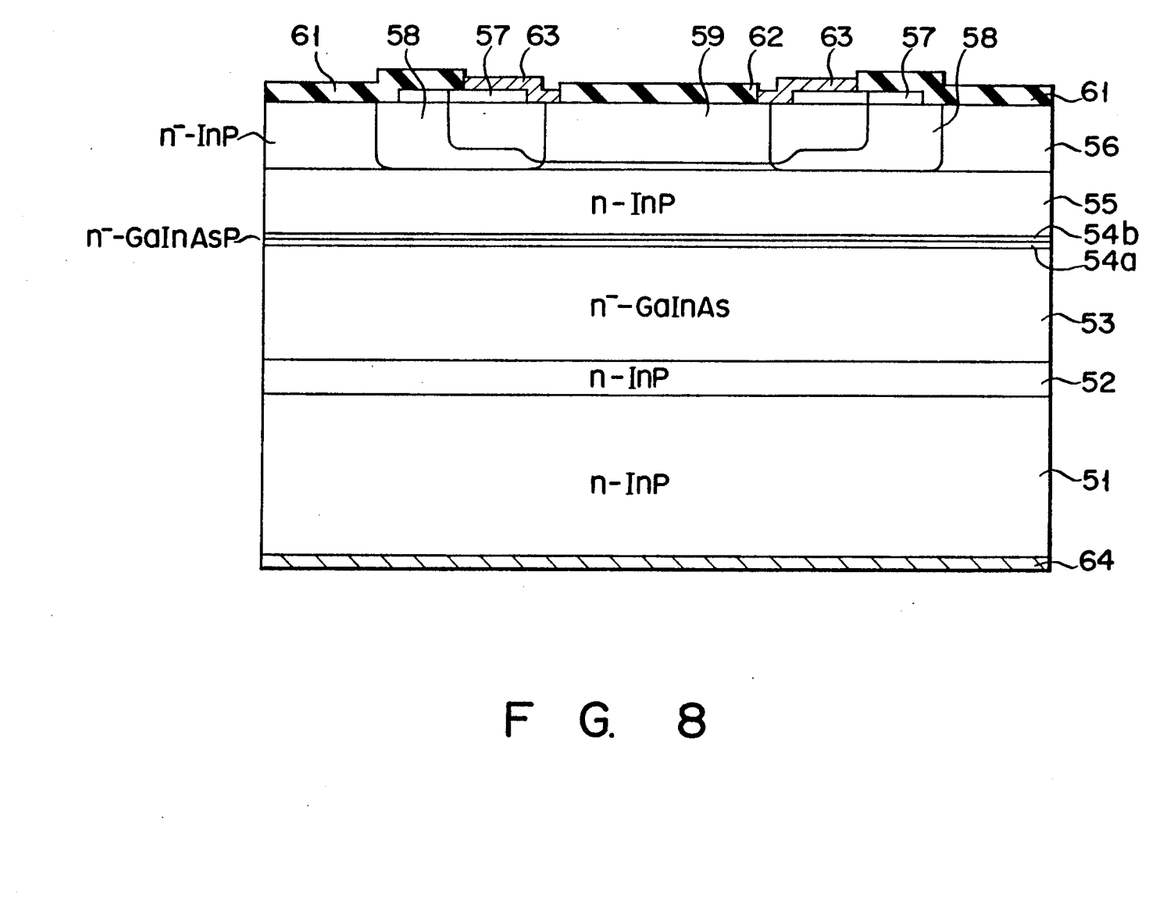
FIG. 8 is a sectional view showing a structure of an APD according to a third embodiment of the present invention.

FIG. 8 is a sectional view showing a schematic structure of an APD according to a third embodiment of the present invention. In FIG. 8, reference numeral 51 denotes an n-Inp substrate. On the substrate 51, an n-InP buffer layer 52, an n$^-$-GaInAsP light detecting layer 53 (having a composition lattice-matched with InP), an n$^-$-GaInAsP first intermediate layer 54a (absorption wavelength: 1.3 μm), an n$^-$-GaInAsP second intermediate layer 54b (absorption wavelength: 1.1 μm), an n-InP avalanche multiplication/electric field relaxation layer 55, an n$^-$-InP window layer 56 are grown and formed, and an annular semiconductor spacing layer 57 in formed thereon. The spacing layer 57 consists of, e.g., InP. The spacing layer 57 may be a crystal of GaInAsP, GaInAs, or the like. When the composition and thickness of the spacing layer 57 may be changed depending on the structure design and process conditions. The two intermediate layers are used in this embodiment unlike the above embodiments in order to decrease the discontinuity of the band gap between the light detecting layer 53 and the electric relaxation layer 55.

The concentration and thickness of each semiconductor layer are determined as follows. For example, the buffer layer 52 has a concentration of $4 \times 10^{16}$ cm$^{-3}$ and thickness of 0.5 μm, the light absorption layer 53 has a concentration of $5 \times 10^{15}$ cm$^{-3}$ or less and a thickness of 2 μm, each of the first and second intermediate layers 54a and 54b has a concentration of $5 \times 10^{15}$ cm$^{-3}$ and a thickness of 0.1 μm, the avalanche multiplication/electric field relaxation layer 55 has a concentration of $4 \times 10^{16}$ cm$^{-3}$ and a thickness of 0.9 μm, the window layer 56 has a concentration of $5 \times 10^{15}$ cm$^{-3}$ or less and a thickness of 1 μm, and the spacing layer 57 has a concentration of $5 \times 10^{15}$ cm$^{-3}$ or less and a thickness of 0.4 μm.

Portions except for the semiconductor layers will be described below. Reference numeral 58 denotes a p-type region (guard ring) formed by implanting Be ions to define a moderately graded p-n junction; 59, a p-type region (light detecting region) formed by thermal diffusion of Cd to define a steeply graded p-n junction; 61, a passivation film (e.g., a silicon nitride film: thickness of 2,000 Å); 62, a non-reflection coating layer; and 63 and 64, electrodes (e.g., Ti/Pt/Au: 1,500/500/5,000 Å, and ArGe/Au: 2,000/5,000 Å). Be in the p-type region 58 and Cd in the light detecting region 59 can be replaced by other acceptor impurities (e.g., Mg or Zn), or a means for doping the impurities may be replaced.

Although the structure of this device is substantially the same as that in the first embodiment, the method of manufacturing the device in this embodiment is largely different from that in the first embodiment. FIGS. 9A to 9D are sectional views showing the steps in manufacturing the device shown in FIG. 8. One side of the guard ring is shown in FIGS. 9A to 9D, and the semiconductor layers below the n-InP layer 55 are omitted. The detailed structure elements of the layers are the same as in FIG. 8.

Figure 9A:
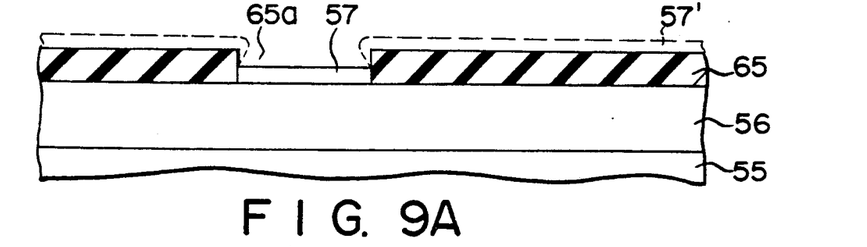
FIGS. 9A to 9D are sectional views showing the steps in manufacturing the APD shown in FIG. 8.

As shown in FIG. 9A, crystal growth of the semiconductor layers 52 to 56 shown in FIG. 8 is performed. For example, an MOCVD method is used as a crystal growth method. This crystal growth is performed at 620° C. Then, e.g., an $SiO_2$ film 65 having a thickness of 1 μm is formed on the $n^-$-InP layer 56 as a mask for performing selective crystal growth and ion implantation. An annular window 65a corresponding to a guard ring portion is formed. The annular window 65a has an inner diameter of, e.g., 40 μm and an outer diameter of, e.g., 60 μm. The annular window 65a is formed by normal photolithography and wet etching using an $NH_4F$ aqueous solution. Using the MOCvD again, the InP spacing layer 57 is selectively grown in the annular window 65a formed in the $SiO_2$ mask 65. At this time, although a polysilicon substance 57' is often precipitated on the mask 65 depending on the crystal growth conditions, it can be disregarded in this case. A refractory material having an ultimate conductivity wherein an impurity can be diffused can be employed as the material of the spacing layer 57. Therefore, an amorphous layer may be used as the spacing layer. As for the manufacturing method, deposition may be performed by sputtering or CVD.

Figure 9B:
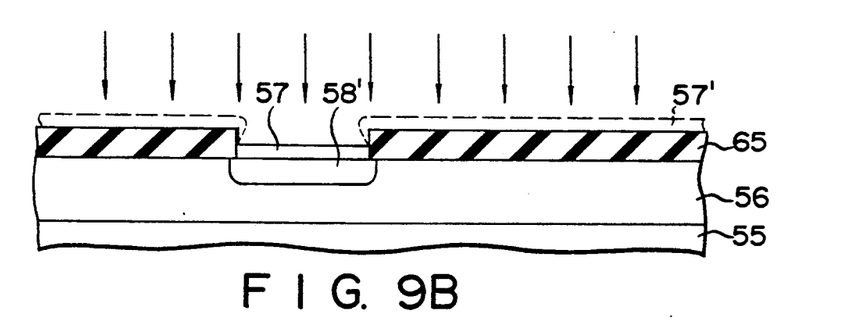

As shown in FIG. 9B, a Be ion implantation region 58' is formed by ion implantation. The implantation conditions are as follows. For example, the ion implantation is performed at an accelerated voltage of 200 keV and a dose of $1 \times 10^{13}$ cm$^{-2}$.

Figure 9C:
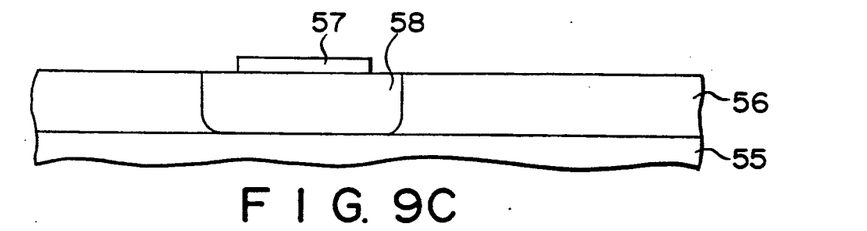

As shown in FIG. 9C, the mask 65 is then removed. Thereafter, a thermal treatment (crystal annealing) is performed in an atmosphere containing extra P. The mask 65 may be removed using an HF aqueous solution or an $NH_4F$ aqueous solution. For example, annealing is performed in an atmosphere of an $H_2$ gas containing $PH_3$ of 10,000 ppm at 750° C. for 10 minutes after the mask 65 is removed. Note that this annealing may be performed while the mask 65 remains. Another cover mask (e.g., a glass layer consisting of PSG or ASG) may be formed after the mask 65 is removed, and so-called cap annealing may be performed.

By the above steps, the annular projection 57 obtained by selective crystal growth and the p-type region (guard ring) self-aligned therewith are formed. One photoetching process is performed before this step. Note that the diffusion front of the guard ring 58 is located near the interface between the layers 55 and 56.

Figure 9D:
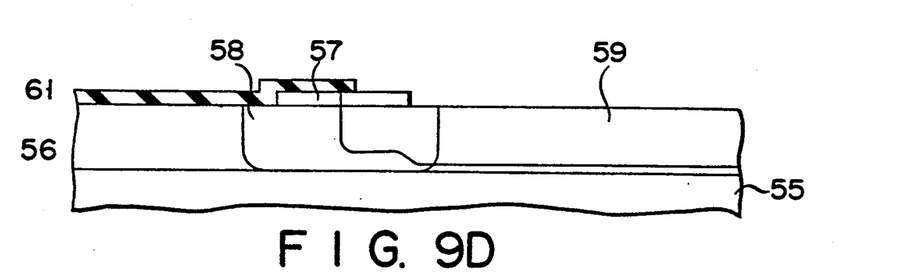

Thereafter, as shown in FIG. 9D, the mask 61 for thermal diffusion of Cd is deposited by plasma CVD, and a window of the light detecting region (Cd diffusion portion) is formed by normal photolithography and dry etching using a $CF_4$ gas. The mask 61 finally remains as a passivation film. The mask 61 need not be formed in this step. The ion implantation and selective growth mask 65 having a two-layer structure of a silicon nitride layer (2,000 Å) and an $SiO_2$ layer (8.000 Å) may be formed in the step shown in FIG. 9B, and the $SiO_2$ layer may be selectively removed by etching using an $NH_4F$ aqueous solution after the ion-implantation process. At this time, the silicon nitride film formed on the inner peripheral portion and the interior of the annular projection is removed by photolithography.

Sequentially, using $Cd_3P_2$ as a diffusion source, for example, the thermal diffusion is performed at 560° C. for 10 minutes to diffuse Cd, thus forming the p-type region (light detecting region 59). At this time, due to the presence of the spacing layer 57, the depth of the central diffusion front of the light detecting region 59 is smaller than that of the peripheral diffusion front of the region 59. After this step, by forming the non-reflection coating film 62 and the electrodes 63 and 64, the abovementioned structure shown in FIG. 8 can be realized.

Figure 10A:
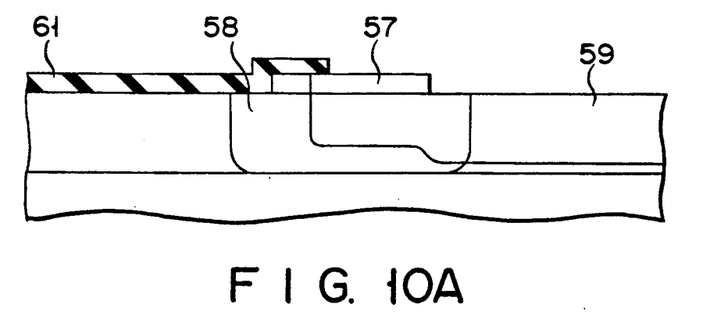
FIGS. 10A to 10C are sectional views showing examples in which a position of masking layer for forming a light detecting region is varied.
Figure 10B:
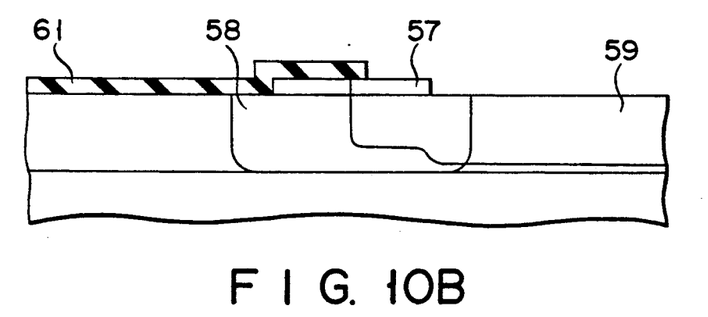
Figure 10C:
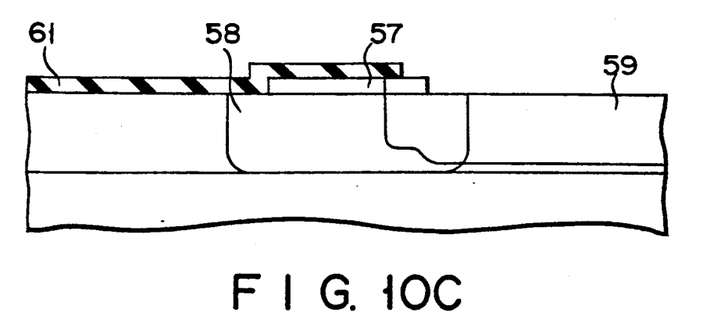

Although the pattern is self-aligned before the step in FIG. 9C, photolithography is performed again in the step in FIG. 9D. Therefore, the self-alignment of the pattern may undesirably tends to be lost. However, the self-alignment is not substantially lost in this embodiment, as shown in FIGS. 10A to 10C. FIGS. 10A to 10C correspond to the above-mentioned step shown in FIG. 9D, and show a case wherein the position of the window of the light detecting region (Cd diffusion portion) in the Cd thermal diffusion mask 61 is gradually shifted relatively to the annular spacing layer 57. As is understood from FIGS. 10A to 10C, the pattern shift can hardly affect the element structure when the shift width does not exceed the width of the firstly formed annular window.

Figure 11:
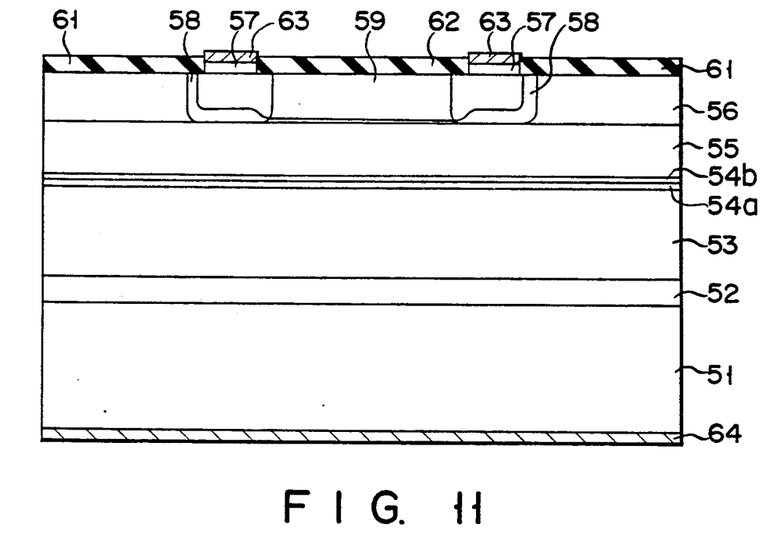
FIG. 11 is a sectional view showing a structure of the APD obtained when a part of a masking layer for forming a guard ring also serves as a part of a masking layer for forming a light receiving layer.

More specifically, as shown in FIGS. 10A to 10C, even if the position of the mask pattern 61 is shifted, a position at which a deformed region of the Cd diffusion overlaps the guard ring 58 is not changed, and a width at which the deep portion (bottom of the step of the Cd diffusion front portion overlaps the guard ring 58 (i.e. a distance between the inner edge of the guard ring 58 and the stepped portion of the Cd diffusion region) is also kept constant. Therefore, the amount of dark current which tends to be generated in a region wherein the Cd diffusion front portion overlaps the guard ring is also kept constant. In addition, since the overlapping width is small, an absolute value of the dark current is also small as compared with that in the conventional guard ring structure. Note that when the Cd diffusion mask 61 also serves as the first ion implantation mask, as described above, the Cd diffusion region includes the entire regions below the annular projection, and the outer periphery substantially coincides with the outer periphery of the annular projection, and is self-aligned. The structure of the device thus obtained is shown in FIG. 11.

According to the above-mentioned method of forming a spacing layer by selective growth using a mask having an annular window, since the annular window of the mask also serves as a mask window for the impurity implantation of the moderately graded junction (guard ring), their positions are self-alinged. In addition, when an impurity for forming a steeply graded junction is doped, the steeply graded junction is deformed in the inner periphery of the semiconductor spacing layer obtained by selective growth. Therefore, the positions of the inner periphery of the guard ring and the steeply graded junction deformed portion are self-aligned. Therefore, an overlap margin of the patterns of the semiconductor spacing layer and the guard ring is not required as compared with a case wherein the semiconductor spacing layer and the guard ring are individually formed, so that the area of the p-n junction is reduced and the parasitic capacitance of the element can be decreased without degrading the guard ring performance. In addition, since the depth of the crystal growth of the semiconductor spacing layer is relatively small, an increase in cost caused by the crystal growth is cancelled by a decrease in steps of the mask alignment and an increase in yield of the elements achieved by providing a self-alignment process. Therefore, a precision of the projection step can be improved by the crystal growth, and hence the performance and reproducibility of the devices are improved, thus effectively improving the entire cost performance.

Figure 12:
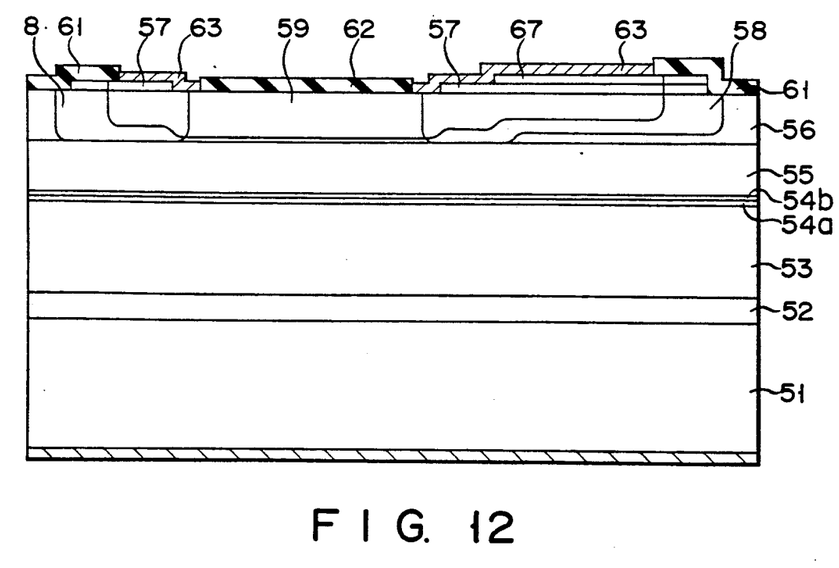
FIG. 12 is a sectional view showing a structure of an APD according to a fourth embodiment of the present invention.

FIG. 12 is a sectional view showing a schematic structure of an APD according to a fourth embodiment of the present invention. The same reference numerals in FIG. 12 denote the same parts as in FIG. 8, and a detailed description thereof will be omitted.

In this embodiment, a bonding pad region is formed in the structure shown in FIG. 8 to perform wire-bonding. The bonding pad of the optical communication APD often has an area substantially equal to the p-n junction area of the element, and the parasitic capacitance of the bonding pad tends to cause a problem. Therefore, the thickness of an insulating film below the bonding pad is normally increased or a guard ring often extends below the bonding pad. FIG. 12 shows the latter example wherein a dark current is improved as compared with the normal case.

More specifically, two layers 57 and 67 are formed by selective crystal growth in the step shown in FIG. 9B in this embodiment, and the second layer 67 except for the bonding pad is selectively removed before the ion implantation step. Then, the following processes are performed in the same manner as in FIGS. 9C and 9D, thus obtaining the structure shown in FIG. 12. In the bonding pad portion, the junction depths of Be moderately graded junction and Cd steeply graded junction are small. For this reason, an electric field value is not unnecessarily increased in a light absorption layer 53 below the bonding pad, and an increase in dark current due to an increase in guard ring area can be suppressed.

FIGS. 13A, 13B, 14A, and 14B show an improved example for preventing abnormal growth which tends to occur in the selective growth step in FIG. 9B. In this selective growth, a crystal material which has reached a portion covered with the mask performs thermal motion on the mask surface. The crystal material stays in a low-energy region on the mask surface or is reevaporated from the mask surface to perform energy storage. Therefore, in the original selective crystal growth wherein polycrystalline substances are not precipitated on the mask surface, it is preferable that all the crystal materials are reevaporated from the mask surface. However, when an average free stroke of the crystal material on the mask surface is long, the crystal material often moves on the mask to reach the mask interface. The crystal material which has reached the mask surface is supplied to the underlying crystal on the mask interface as an extra crystal material. In the crystal growth such as MOCVD depending on a flow of a gas in a vapor phase, a deposition material flow tends to be temporarily discontinued or stopped at the mask interface. An increase in concentration of the crystal material molecules occurs or the moving molecules on the mask surface are undesirably drawn at the mask interface.

Figure 13A:
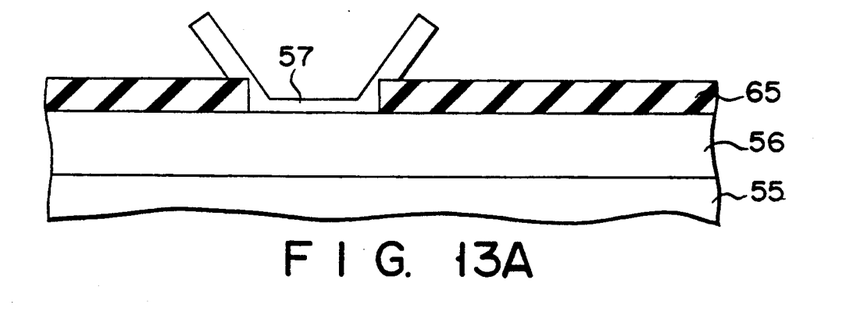
FIGS. 13A and 13B are sectional views showing abnormal growth in selective deposition or crystal growth to form an annular semiconductor layer.
Figure 13B:
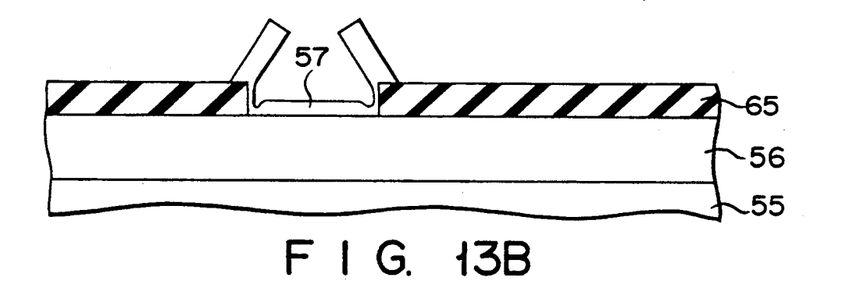

When the above situations are complex and related to each other to cause abnormal growth and, in particular, when the surface orientation dependency of the crystal is present, the projection shown in FIGS. 13A and 13B tends to be grown. FIGS. 3A and 13B show an example wherein the selective crystal growth is performed on the (001) surface of the InP substrate. This growth occurs in the <110> and <110> crystal orientation directions. Such abnormal growth causes a fault in photolithography, or poor or degraded device characteristics.

Figure 14A:
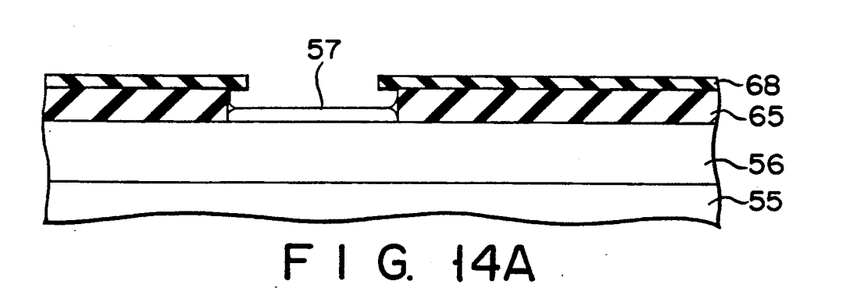
FIGS. 14A and 14B are sectional views showing a structure for preventing the abnormal growth shown in FIGS. 13A and 13B.
Figure 14B:
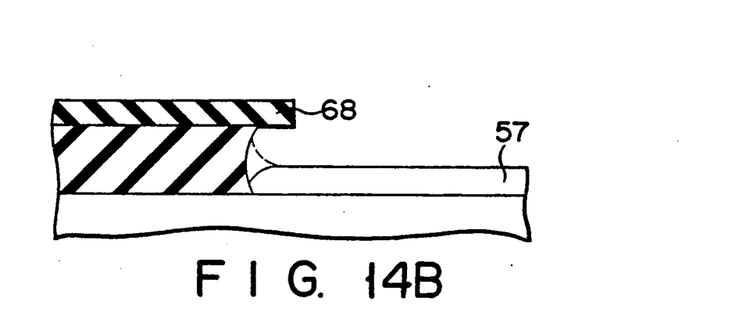

FIGS. 14A and 14B show a method of solving the above problems. In FIGS. 14A and 14B, the selective crystal growth mask has a two-layer structure. For example, a selective crystal growth mask is obtained by stacking a silicon nitride film 68 on an $SiO_2$ film 65. For example, the $SiO_2$ film 65 has a thickness of 8,000 Å, and the silicon nitride film 68 has a thickness of 2,000 Å. First, the silicon nitride film 68 is patterned by dry etching. Then, the $SiO_2$ film 65 is patterned by an $NH_4F$ aqueous solution and an overhang of the silicon nitride film 68 is formed utilizing a difference of the etching rates between the $SiO_2$ film 65 and the silicon nitride film 68. Thereafter, selective crystal growth is performed to allow crystal growth without growth of a projection, as shown in FIGS. 14A and 14B. This crystal growth can ba performed because the molecules which have moved on the mask surface are easily vapored at the overhang. Even though slight abnormal growth is recognized, extreme projection growth can hardly occur. At this time, if the thickness of the crystal growth on the mask interface may become large or small, the thickness may be optimized in accordance with the conditions of the following process. Even if a mask having a three-layer structure obtained by combining the above-mentioned method using the $SiO_2$ film on the silicon nitride film is employed, this method can be similarly performed. Even if a mask material is changed, this method can be utilized.

The present invention is not limited to the above embodiments, and various changes and modifications may be made without departing from the spirit and scope of the invention.

More specifically, although the multi-layer structure consisting of InP-GaInAs-GaInAsP is employed in this embodiment, the present invention is not limited thereto, and a proper change may be made in accordance with the technical specifications. For example, a multi-layer structure consisting of InP-GaInAs-AlInAs, or Si-SiGe-Si can be employed.

The material of the spacing layer is not limited to a single crystal of GaInAs, GaInAsP or InP, and polycrystalline or amorphous deposit or the other material such as AlGaAs and AlInAs can be employed. In addition, although semiconductor layers of an n conductivity type are formed in the above embodiments, p-type semiconductor layers can be formed. In this case, the guard ring and light detecting region have the n conductivity type. Si, Sn or the like can be used as an n-type impurity.

As has been described above in detail, according to the present invention, in a steeply graded p-n junction, the peripheral junction depth is smaller than the central junction depth. Therefore, a sufficient guard ring effect can be obtained while surface flatness of the semiconductor multi-layered film is kept. Therefore, a high breakdown voltage of a guard ring can be obtained and a dark current can be minimized. As a result, a high manufacturing yield can be realized with on increase in the manufacturing cost.

What is claimed is:

1. A semiconductor light detector comprising:

a first semiconductor layer of a first conductivity type having a multi-layer structure including a light absorbing layer, an avalanche multiplication layer, and a window layer having a flat surface;

a light detecting region formed in the window layer, said light detecting region defining a first p-n junction in combination with said first semiconductor layer; and a guard ring formed in the window layer to surround said peripheral portion of said light detecting region, said guard ring defining a second p-n junction in combination with said first semiconductor layer, the guard ring defining the second p-n junction having a concentration gradient lower than that of the light detecting region defining said first p-n junction, wherein the junction depth of said peripheral portion of said light detecting region is less than that of a central portion of said light detecting region, and a junction depth of said guard ring is greater than that of said peripheral portion of said light detecting region.

2. A semiconductor light detector comprising:

a first semiconductor layer of a first conductivity type having a multi-layer structure including a light absorbing layer, an avalanche multiplicating layer and a window layer serving as a surface layer of the first semiconductor layer;

an annular second semiconductor layer formed on said window layer;

a light detecting region of a second conductivity type formed in said window layer, in such a manner that a peripheral portion of said light detecting region is located outside an inner periphery of said second semiconductor layer, said light detecting region defining a first p-n junction in combination with said first semiconductor layer; and a guard ring of a second conductivity type formed in the window layer, to surround said peripheral portion of said light detection region, said guard ring defining a second p-n junction in combination with said first semiconductor layer, said guard ring defining the second p-n junction having a concentration gradient lower than that of said light detecting region defining said first p-n junction, wherein the junction depth of said peripheral portion of said light detecting region is less than that of a central portion of said light detecting region, and a junction depth of said guard ring is greater than that of said peripheral portion of said light detecting region.

3. A detector according to claim 2, wherein the junction depth of said guard ring is less than that of said central portion of said light detecting region.

4. A detector according to claim 2, wherein the junction depth of said guard ring is greater than that of said central portion of said light detecting region.

5. A detector according to claim 2, wherein the junction depth of said guard ring is equal to the thickness of said window layer.

6. A detector according to claim 2, wherein said second semiconductor layer consists of a conductive material in which an impurity can be diffused.

7. A detector according to claim 6, wherein said conductive material is selected from the group consisting of InP, GaInAsP, GaInAs, AlInAs and AlGaAs.

8. A detector according to claim 2, wherein said light absorbing layer consists of GaInAsp or GaInAs, and said avalanche multiplicating layer and said window layer consist of InP.

9. A detector according to claim 2, wherein said light absorbing layer consists of SiGe, and said avalanche multiplicating layer and said window layer consist of Si.

10. A detector according to claim 2, wherein said annular second semiconductor layer is of two-layer structure.

11. A semiconductor light detector comprising:

a substrate of a first conductivity type formed of InP;

a buffer layer of a first conductivity type formed on the substrate and formed of InP;

a light absorption layer of a first conductivity type formed on the buffer layer and formed of GaInAs;

an intermediate layer of a first conductivity type formed on the light absorption layer and formed of GaInAsP;

a multiplication layer of a first conductivity type formed on the intermediate layer and formed on InP;

a window layer formed on the multiplication layer and formed of InP;

an annular spacing layer selectively formed on the window layer and formed of GaInAspP;

a light detecting region of a second conductivity type formed in the window layer in such a manner that a peripheral portion of said light detecting region is located outside an inner periphery of said annular spacing layer, said light detecting region defining a first p-n junction in combination with said window layer; and a guard ring of a second conductivity type formed in the window layer to surround said peripheral portion of said light detecting region, said guard ring defining a second p-n junction in combination with said window layer, said guard ring defining the second p-n junction having a concentration gradient lower than that of the light detecting region defining the first p-n junction, wherein the junction depth of said peripheral portion of said light detecting region is less than that of a central portion of said light detecting region, and a junction depth of said guard ring is greater than that of said peripheral portion of said light detecting region.

* * * * *